(12) United States Patent
Kang et al.

(10) Patent No.: US 12,550,771 B2
(45) Date of Patent: Feb. 10, 2026

(54) DOUBLE STITCH WIREBONDS

(71) Applicant: TEXAS INSTRUMENTS INCORPORATED, Dallas, TX (US)

(72) Inventors: Xiaolin Kang, Chengdu (CN); Ziqi Wang, Chengdu (CN); Huoyun Duan, Chengdu (CN); Peng Peng, Chengdu (CN); Ye Zhuang, Chengdu (CN); Xiaoling Kang, Chengdu (CN); Hongxia Deng, Chengdu (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 580 days.

(21) Appl. No.: 17/956,794

(22) Filed: Sep. 29, 2022

(65) Prior Publication Data

US 2024/0113065 A1 Apr. 4, 2024

(51) Int. Cl.
*H01L 23/00* (2006.01)

(52) U.S. Cl.
CPC ............ *H01L 24/48* (2013.01); *H01L 24/85* (2013.01); *H01L 2224/48175* (2013.01); *H01L 2224/48456* (2013.01); *H01L 2224/48465* (2013.01); *H01L 2224/85201* (2013.01)

(58) Field of Classification Search
CPC ... H01L 2224/4801; H01L 2224/48011; H01L 2224/4807; H01L 2224/48458; H01L 2224/4846
See application file for complete search history.

(56) References Cited

U.S. PATENT DOCUMENTS

| | | | | |
|---|---|---|---|---|
| 4,415,115 A * | 11/1983 | James | ..................... | H01L 24/85 228/180.5 |
| 6,774,494 B2 * | 8/2004 | Arakawa | ................. | H01L 24/85 257/784 |
| 7,064,433 B2 * | 6/2006 | Wong | ..................... | H01L 24/85 257/737 |
| 7,083,077 B2 * | 8/2006 | Wildner | ............. | H01R 43/0207 228/8 |
| 7,214,606 B2 * | 5/2007 | Wong | ..................... | H01L 24/48 257/784 |
| 7,741,208 B2 * | 6/2010 | Seidel | ..................... | H01L 24/48 257/E21.48 |

(Continued)

FOREIGN PATENT DOCUMENTS

DE 19508617 C1 * 5/1996 ............. B23K 20/10
EP 1722409 A1 * 11/2006 ........... B23K 20/004

(Continued)

OTHER PUBLICATIONS

Machine Translation, JP 2005 123388 A; May 12, 2005. 14 pages. (Year: 2005).*

*Primary Examiner* — Scott B Geyer

(74) *Attorney, Agent, or Firm* — Dawn Jos; Frank D. Cimino

(57) ABSTRACT

In some examples, a semiconductor package comprises an electrically conductive surface and a bond wire coupled to the electrically conductive surface. The bond wire includes a first stitch bond coupled to the electrically conductive surface, and a second stitch bond contiguous with the first stitch bond and coupled to the electrically conductive surface. The second stitch bond is partially, but not completely, overlapping with the first stitch bond.

15 Claims, 13 Drawing Sheets

(56) References Cited

U.S. PATENT DOCUMENTS

| | | | | |
|---|---|---|---|---|
| 8,016,182 B2* | 9/2011 | Shirato | B23K 20/004 | |
| | | | 228/110.1 | |
| 8,123,108 B2* | 2/2012 | Akiyama | H01L 24/85 | |
| | | | 228/180.5 | |
| 8,357,998 B2* | 1/2013 | Huang | H01L 24/78 | |
| | | | 257/676 | |
| 9,263,418 B2* | 2/2016 | Kasuya | H01L 24/85 | |
| 9,992,861 B2* | 6/2018 | Middendorf | H05K 1/0271 | |
| 2002/0137327 A1* | 9/2002 | Arakawa | H01L 25/0657 | |
| | | | 257/784 | |
| 2003/0019098 A1* | 1/2003 | Wildner | B23K 20/004 | |
| | | | 29/745 | |
| 2004/0104477 A1* | 6/2004 | Fujisawa | B23K 20/007 | |
| | | | 257/738 | |
| 2006/0027623 A1* | 2/2006 | Yanagisawa | H01L 24/78 | |
| | | | 228/180.5 | |
| 2006/0032894 A1* | 2/2006 | Wong | H01L 24/48 | |
| | | | 228/180.5 | |
| 2007/0231959 A1* | 10/2007 | Seidel | H01L 24/48 | |
| | | | 438/106 | |
| 2008/0116548 A1* | 5/2008 | Li | H01L 24/48 | |
| | | | 257/676 | |
| 2008/0136027 A1* | 6/2008 | Moon | H01L 24/48 | |
| | | | 257/738 | |
| 2010/0186991 A1* | 7/2010 | Tajima | B23K 20/004 | |
| | | | 228/155 | |
| 2010/0230809 A1* | 9/2010 | Calpito | H01L 24/05 | |
| | | | 257/737 | |
| 2010/0237480 A1* | 9/2010 | Mii | H01L 24/49 | |
| | | | 257/784 | |
| 2015/0187729 A1* | 7/2015 | Chew | H01L 24/48 | |
| | | | 257/784 | |
| 2019/0157237 A1* | 5/2019 | Lee | H01L 24/85 | |
| 2020/0105708 A1* | 4/2020 | Choi | H01L 24/09 | |
| 2023/0187348 A1* | 6/2023 | Tuncer | H01L 24/49 | |
| | | | 257/665 | |
| 2023/0275060 A1* | 8/2023 | Kang | H01L 24/45 | |
| | | | 257/676 | |

FOREIGN PATENT DOCUMENTS

| | | | | |
|---|---|---|---|---|
| JP | H0230153 A | * | 1/1990 | H01L 24/48 |
| JP | H06291160 A | * | 10/1994 | H01L 24/48 |
| JP | 2000101147 A | * | 4/2000 | H01L 24/48 |
| JP | 2005123388 A | * | 5/2005 | H01L 24/48 |
| JP | 2005303152 A | * | 10/2005 | H01L 23/49575 |
| WO | WO-2013049965 A1 | * | 4/2013 | H01L 24/48 |
| WO | WO-2015024597 A1 | * | 2/2015 | H01L 24/48 |

* cited by examiner

DOUBLE STITCH WIREBONDS

BACKGROUND

Semiconductor chips are often housed inside semiconductor packages that protect the chips from deleterious environmental influences, such as heat, moisture, and debris. A packaged chip communicates with electronic devices outside the package via conductive members, such as leads, that are exposed to surfaces of the package. Within the package, the chip may be electrically coupled to the conductive members using any suitable technique. One such technique is the flip-chip technique, in which the semiconductor chip (also called a "die") is flipped so the device side of the chip (in which circuitry is formed) is facing downward. The device side is coupled to the conductive members using, e.g., solder bumps. Another technique is the wire bonding technique, in which the device side of the semiconductor chip is oriented upward and is coupled to the conductive members using bond wires.

SUMMARY

In some examples, a semiconductor package comprises an electrically conductive surface and a bond wire coupled to the electrically conductive surface. The bond wire includes a first stitch bond coupled to the electrically conductive surface, and a second stitch bond contiguous with the first stitch bond and coupled to the electrically conductive surface. The second stitch bond is partially, but not completely, overlapping with the first stitch bond.

In some examples, a method for manufacturing a semiconductor package comprises coupling a semiconductor die to a die pad, controlling a bonding capillary to form a first stitch bond between a bond wire and an electrically conductive surface of a conductive terminal of the package using a first scrub amplitude in the range of 0.5 microns to 5 microns, translating the bonding capillary horizontally away from the first stitch bond by a distance of at least two times a diameter of the bond wire, controlling the bonding capillary to form a second stitch bond between the bond wire and the electrically conductive surface using a second scrub amplitude in the range of 0.5 microns to 5 microns, controlling the bonding capillary to cut the bond wire and form a tail at the second stitch bond, and applying a mold compound to cover the first and second stitch bonds.

DETAILED DESCRIPTION

Figure 1A:
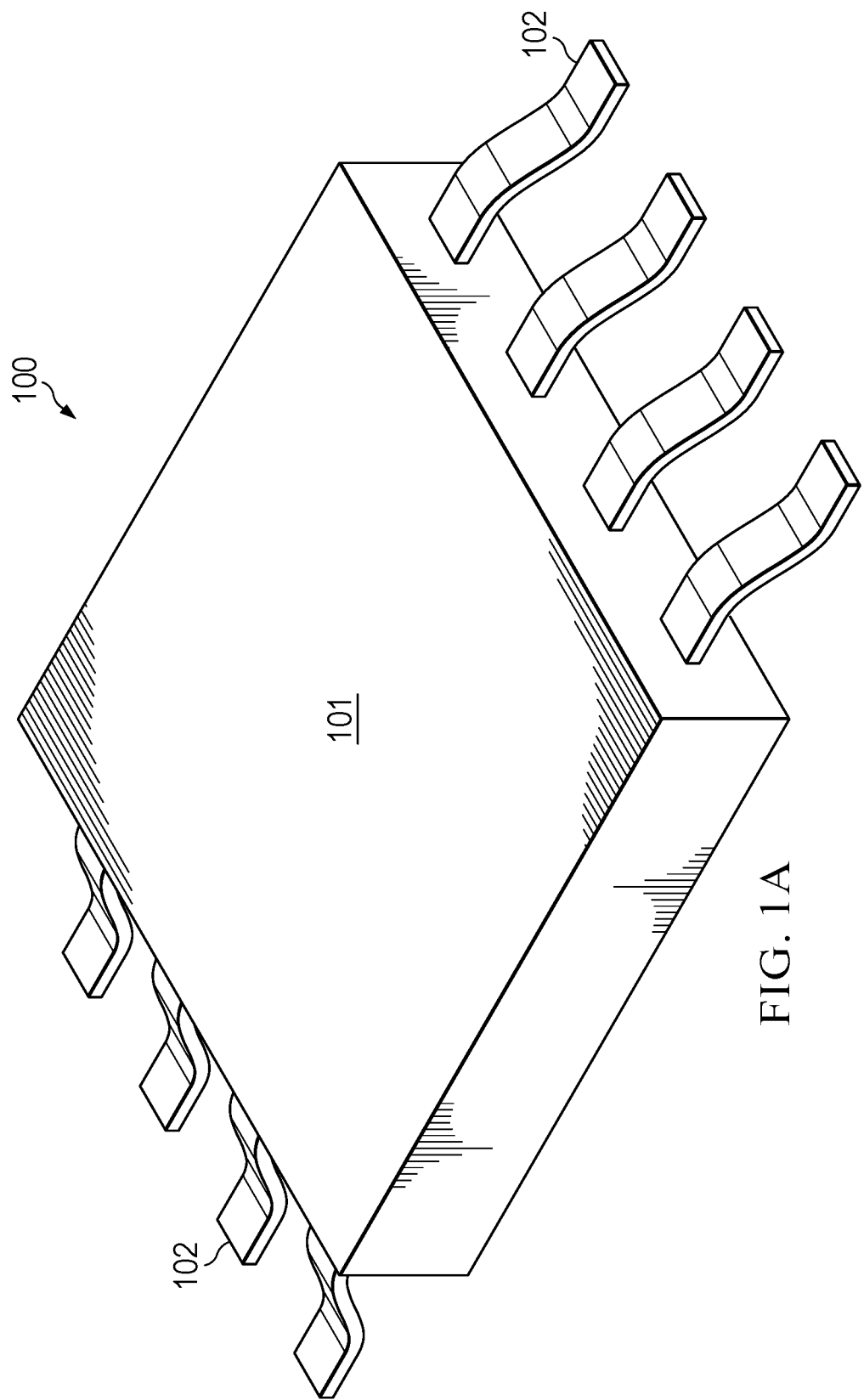
FIGS. 1A, 1B, and 1C are perspective, profile, and top-down views, respectively, of a semiconductor package in accordance with various examples.

As described above, bond wires are useful to couple electrically conductive components within a semiconductor package. For example, bond wires may be useful to couple bond pads on a device side of a semiconductor die to conductive terminals (e.g., leads) that extend from inside the package to an exterior of the package. In this way, bond wires may facilitate the conduction of electrical signals or power. Various techniques may be used to bond a bond wire to an electrically conductive surface, such as to a bond pad. Stitching is a common technique to bond bond wires to surfaces. In stitching, a bond wire is provided through a bonding capillary and is applied to a surface. The capillary subsequently applies force, heat, and ultrasonic energy (e.g., rapid, high-frequency movement in one or more directions in the horizontal plane, also known as "scrubbing") to the bond wire at the point of contact with the surface to bond the bond wire to the surface. A clamp is then closed and the capillary is removed in a manner that cuts the bond wire and completes the stitch bonding process.

Stitch bonds, however, are vulnerable to failure. Specifically, the energy applied (e.g., amount of force, amplitude of ultrasonic motion) during the stitch bonding process affects the resulting structure of the stitch bond, and the structure of the stitch bond can negatively impact the strength of the bond. For example, when relatively low energy is applied during bonding and the capillary is subsequently lifted, the result is a weak, "fish tail" shaped bond with interior pitting that is vulnerable to detachment from the surface to which the bond is applied. Conversely, when relatively high energy is applied during bonding and the capillary is subsequently lifted, the result is a bond of inadequate surface area and/or a bond with cracking, and such bonds are similarly vulnerable to detachment from the surface to which the bonds are applied. It is virtually impossible to properly balance the energy applied during the stitch bonding process to avoid all of the foregoing types of structural defects that promote detachment.

This disclosure describes various examples of a bond that mitigates the challenges associated with traditional stitch bonds, such as the challenges described above. Specifically, the bond described herein, referred to as a double stitch bond, is formed by a multi-step process and includes multiple stitch bonds. In the first step, the capillary bonds the bond wire to a target surface using appropriate levels of heat, force, and scrub amplitude, but the capillary is not lifted away from the bond. The result of this first step is a first stitch bond that is strongly coupled to the target surface. More specifically, the first stitch bond resulting from this first step has adequate length for coupling to the target surface (e.g., does not include a fish tail structure as is typical with capillary lifting after low energy bonding and does not include a short tail as is typical with capillary lifting after high energy bonding) and is devoid of cracking. In the second step, the capillary again applies appropriate levels of heat, force, and scrub amplitude to form a second stitch bond to the target surface and, simultaneously, a tail bond to the target surface. The second stitch bond at least partially overlaps with the first stitch bond. The bond wire is then clamped and the capillary is subsequently lifted, thereby cutting the bond wire and completing the second stitch bond and tail bond. Because the capillary is lifted after formation of the second stitch bond and tail bond, the second stitch bond may suffer from the structural defects typically associated with bonding, such as the aforementioned fish tails, cracks, short tails, etc. However, because the second stitch bond is formed separately from the strong, well-formed first stitch bond, any structural problems affecting the second stitch bond do not affect the first stitch bond. In this way, the separate formation of the two stitch bonds mechanically isolates the first stitch bond from the structural problems found at the second stitch bond. The strong, well-formed first stitch bond increases the reliability, longevity, and manufacturing yield of semiconductor packages containing such bonds.

Figure 1B:
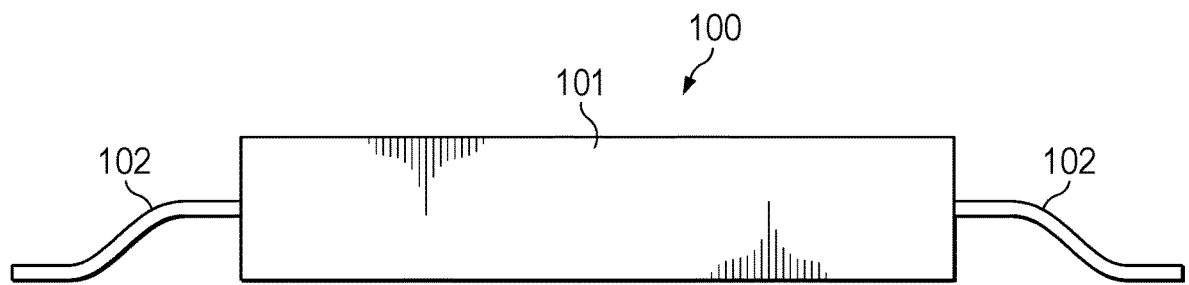
Figure 1C:
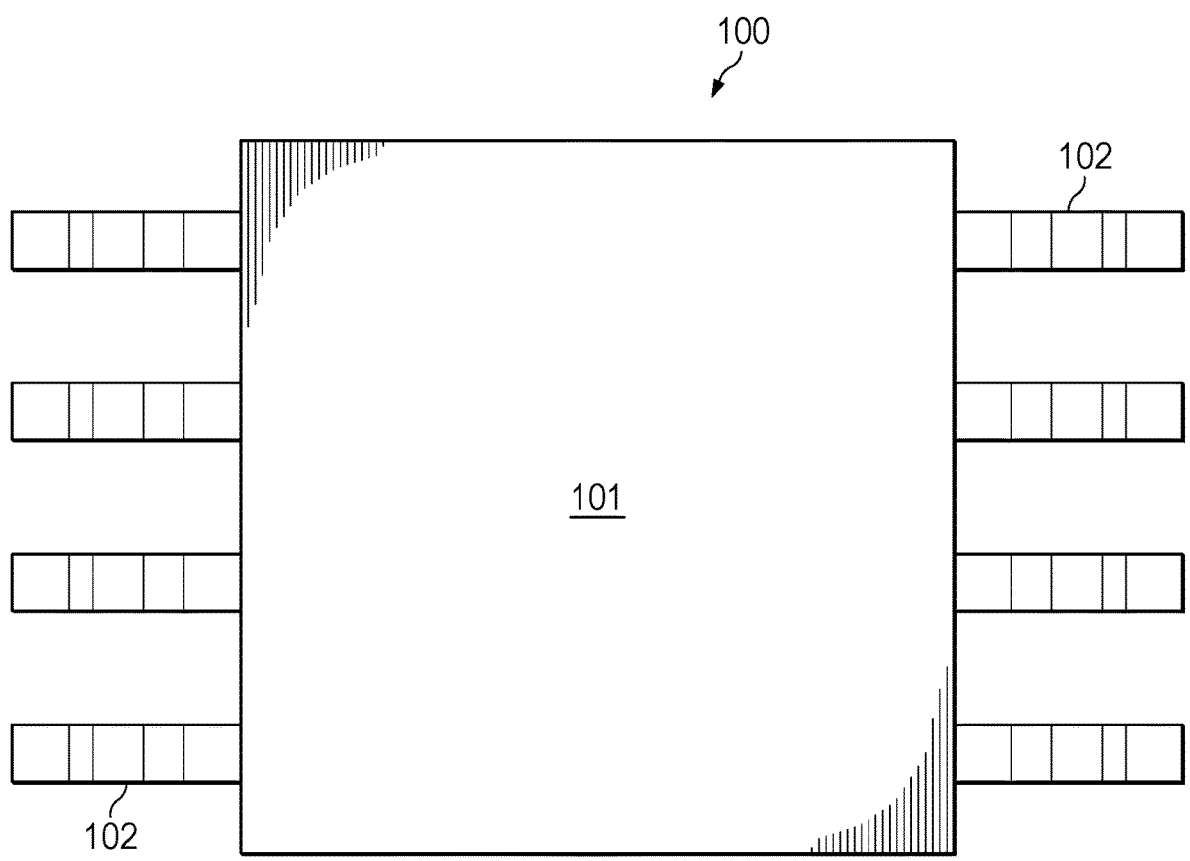

FIGS. 1A, 1B, and 1C are perspective, profile, and top-down views of a semiconductor package 100, respectively, in accordance with various examples. The example semiconductor package 100 may be included in any suitable electronic device or system, such as automobiles, aircraft, spacecraft, appliances, smartphones, personal electronics, entertainment devices and systems, etc. The semiconductor package 100 includes bond wires that are bonded using the double stitch bond technique described herein. The semiconductor package 100 may include a mold compound 101 and conductive terminals 102 extending from the mold compound 101. The semiconductor package 100 may be any suitable type of package that includes wire bonds within, including single inline packages (SIP), dual inline packages (DIP), quad flat no lead packages (QFN), ball grid array packages (BGA), etc.

Figure 2A:
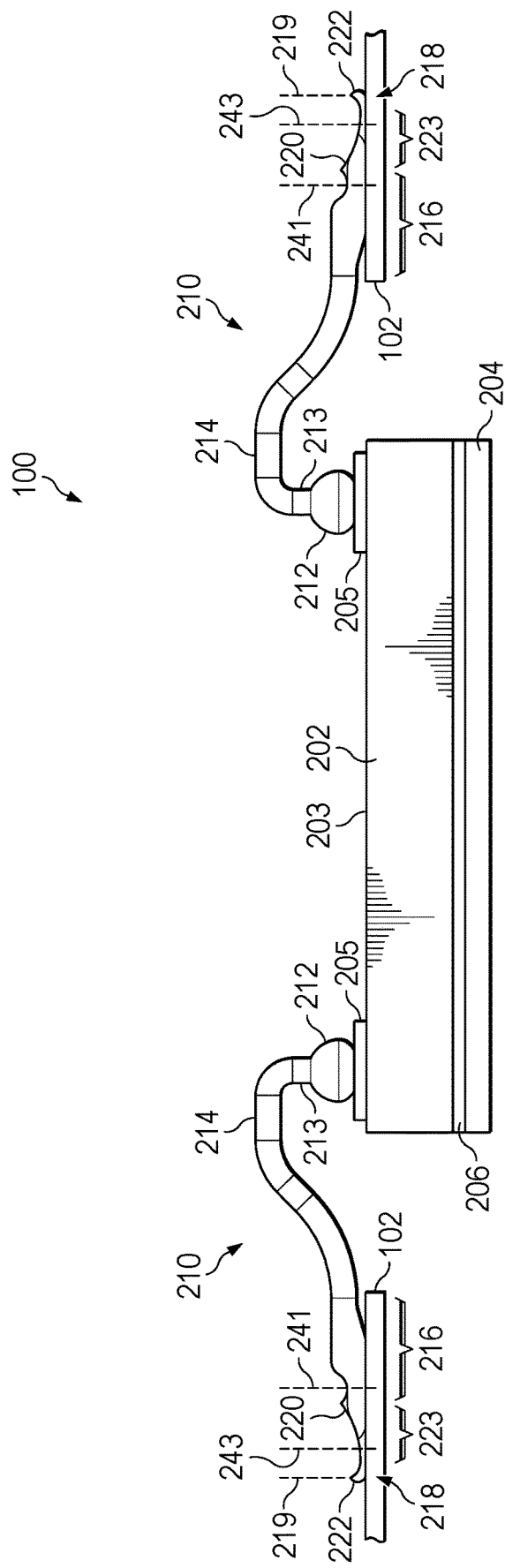
FIGS. 2A, 2B, and 2C are profile, top-down, and perspective views, respectively, of an interior of a semiconductor package in accordance with various examples.
Figure 2B:
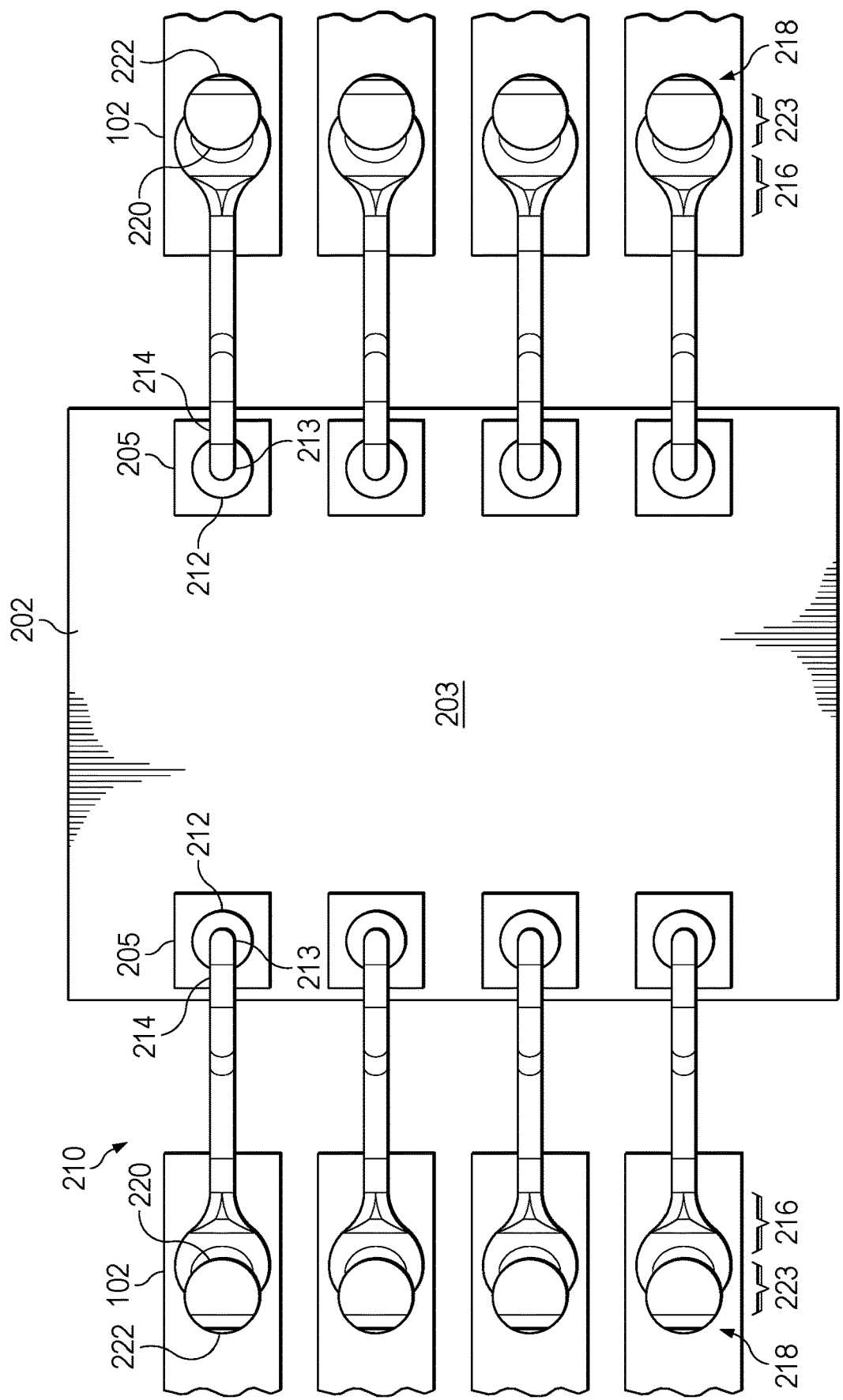
Figure 2C:
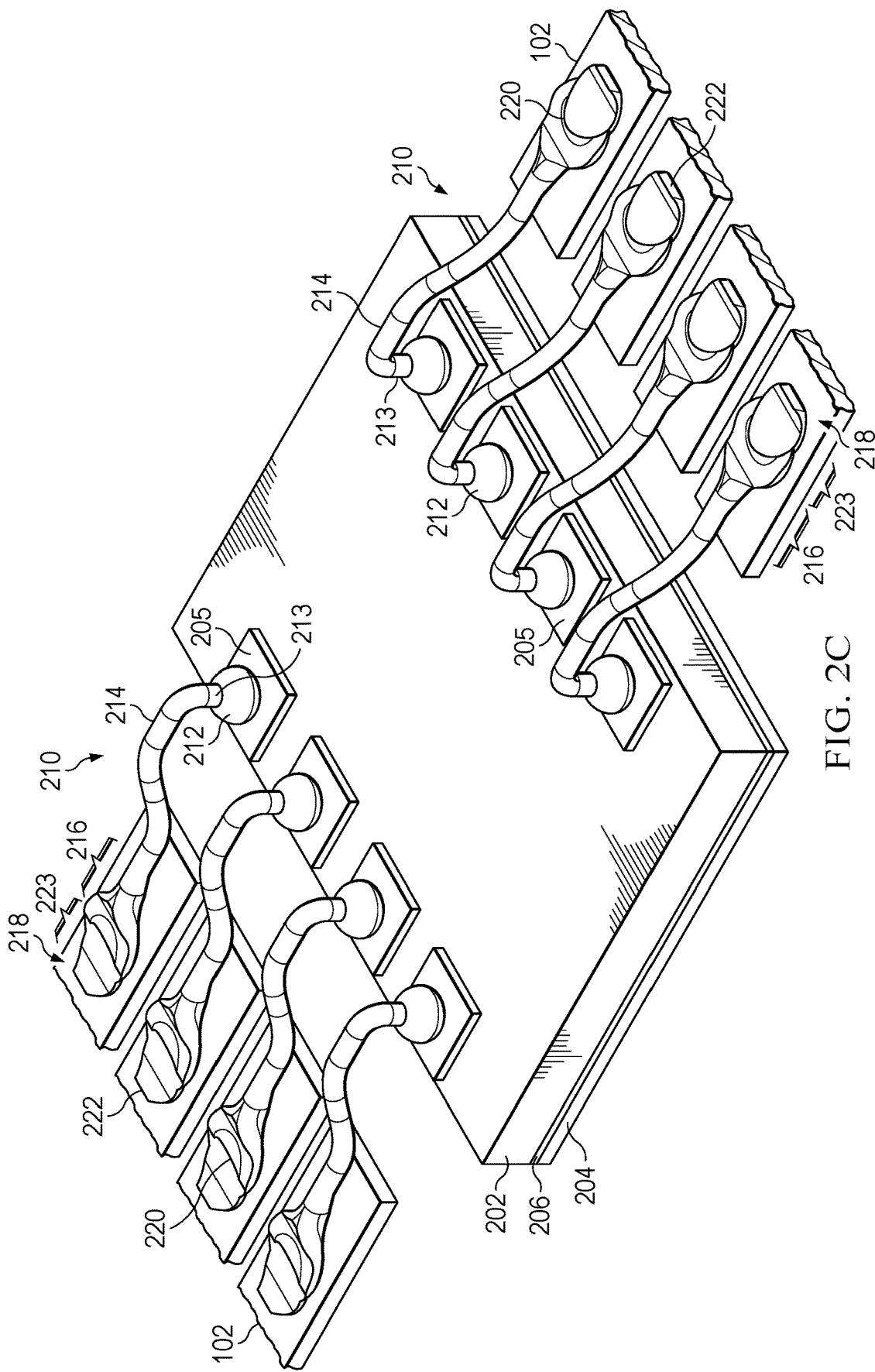

FIGS. 2A, 2B, and 2C are profile, top-down, and perspective views, respectively, of an interior of the semiconductor package 100, in accordance with various examples. The example semiconductor package 100 includes a semiconductor die 202 coupled to a die pad 204 by way of a die attach layer 206. The semiconductor die 202 has a device side 203 in and/or on which one or more circuits are formed. Bond pads 205 are formed on the device side 203 and may be coupled to circuitry on the device side 203, either directly or by way of electrically conductive members, such as metallic (e.g., copper) traces. The semiconductor package 100 includes the conductive terminals 102 (e.g., leads). The conductive terminals 102, which originate within the semiconductor package 100 and extend through the mold compound 101 to an exterior of the semiconductor package 100, have electrically conductive surfaces, thereby facilitating communications between circuitry within the semiconductor package 100 and other electronics outside of the semiconductor package 100. The bond pads 205 are coupled to the electrically conductive surfaces of the conductive terminals 102 by way of bond wires 210. Although two bond wires 210 are shown in FIG. 2A, any number of bond wires may be useful.

Each bond wire 210 includes a ball bond 212, a neck 213, and a span 214. Further, each bond wire 210 is bonded, or coupled, to an electrically conductive surface of a corresponding conductive terminal 102 with a double stitch bond. Each double stitch bond includes a first stitch bond 216 and a second stitch bond 223. A tail bond 218 is also present. In examples, the first stitch bond 216 is more proximal to the ball bond 212 than the second stitch bond 223. Each bond wire 210 has a top surface including a first ridge 220. Similarly, each bond wire 210 has a second ridge at a tail 222 (the tail 222 may also be referred to herein as a second ridge 222) of the bond wire 210 that is vertically coincident with the tail bond 218 of that bond wire 210. Each first stitch bond 216 is contiguous with a corresponding second stitch bond 223 and tail bond 218, meaning that the first stitch bond 216, the second stitch bond 223, and the tail bond 218 are formed from the same continuous piece of bond wire, but are nevertheless separately formed bonds. As described in detail below, a wire bonding capillary establishes contact between a bond wire and the electrically conductive surface of a corresponding conductive terminal 102 and applies a combination of heat, force, and ultrasonic energy to form a stitch bond between the bond wire and the electrically conductive surface. The resulting stitch bond is the first stitch bond 216. The bonding capillary then performs another stitch bonding process between the bond wire and the electrically conductive surface by applying a combination of heat, force, and ultrasonic energy to form the second stitch bond 223, which overlaps with the first stitch bond 216. After the second stitch bond 223 is formed, the clamp is closed and the bonding capillary is lifted in a manner to cut the bond wire, thereby forming the tail 222 at the tail bond 218. The tail bond 218 is vertically coincident with the tail 222, as numeral 219 shows.

As described above, the second stitch bond 223 may be vulnerable to being disconnected from the electrically conductive surface to which it is coupled, but because the second stitch bond 223 is formed separately from the first stitch bond 216 and the first stitch bond 216 was formed without lifting and/or cutting the bond wire 210, the first stitch bond 216 is significantly less vulnerable to the sorts of problems that may lead to the disconnection of the second stitch bond 223 from the electrically conductive surface to which the second stitch bond 223 is coupled. The double stitch bonding technique is now described in greater detail with reference to FIGS. 3A, 3B, 3C, and 3D.

Figure 3A:
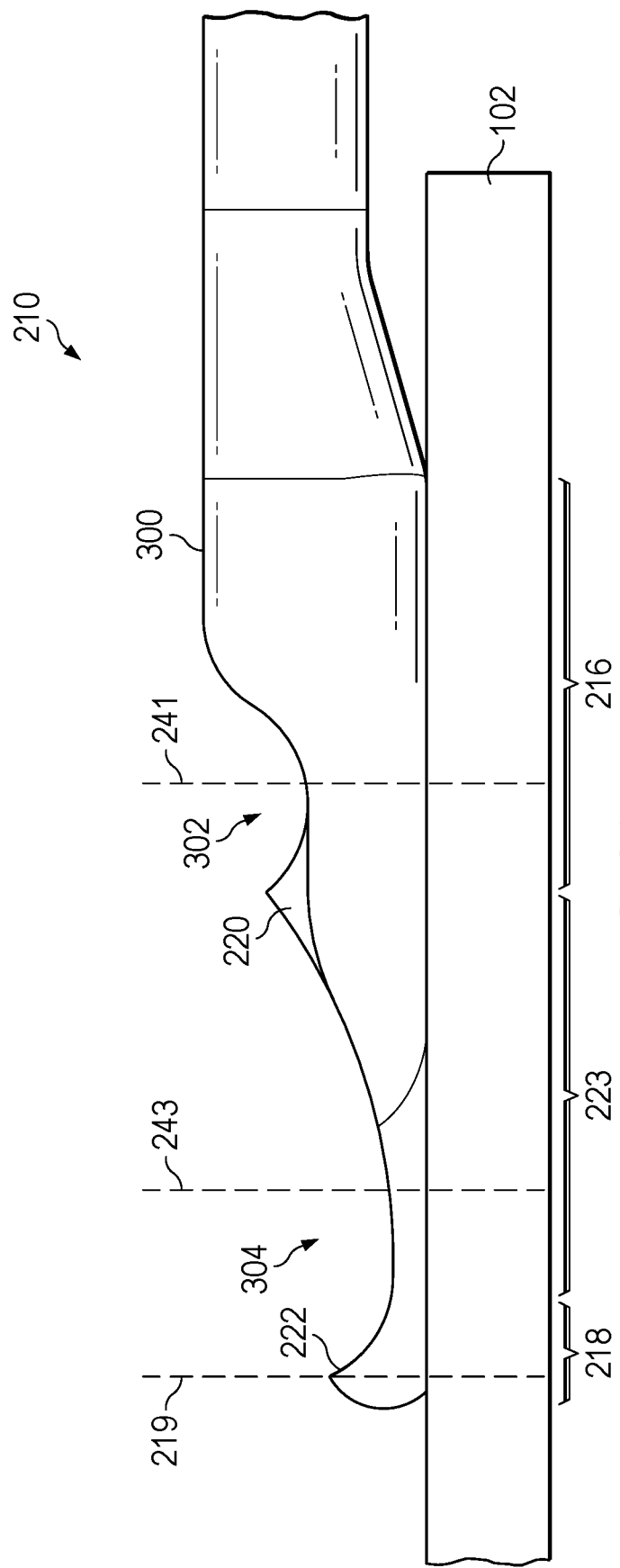
FIGS. 3A, 3B, 3C, and 3D are profile, top-down, frontal, and perspective views, respectively, of a bond wire coupled to an electrically conductive surface by a pair of overlapping stitch bonds, in accordance with various examples.
Figure 3B:
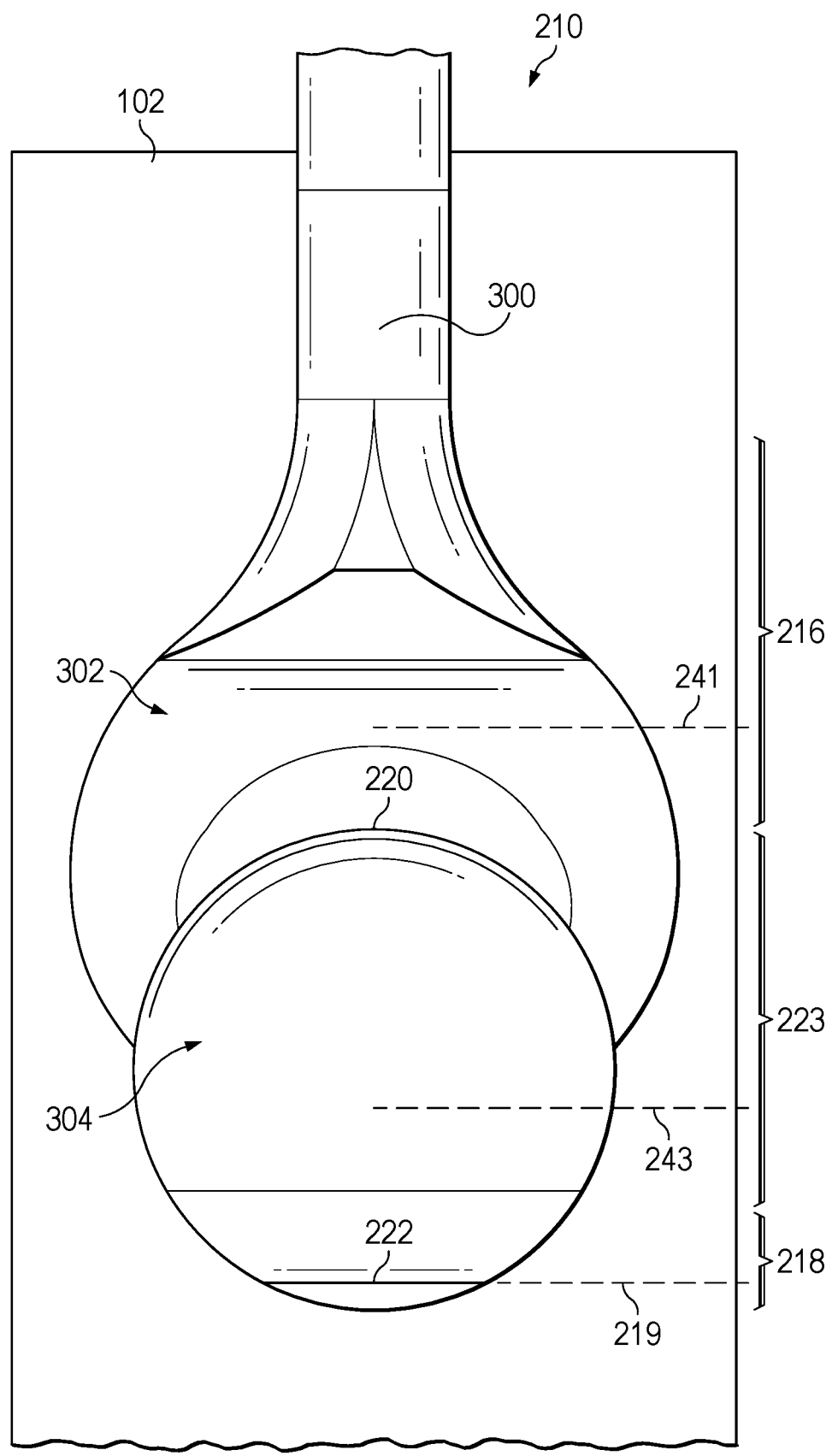
Figure 3C:
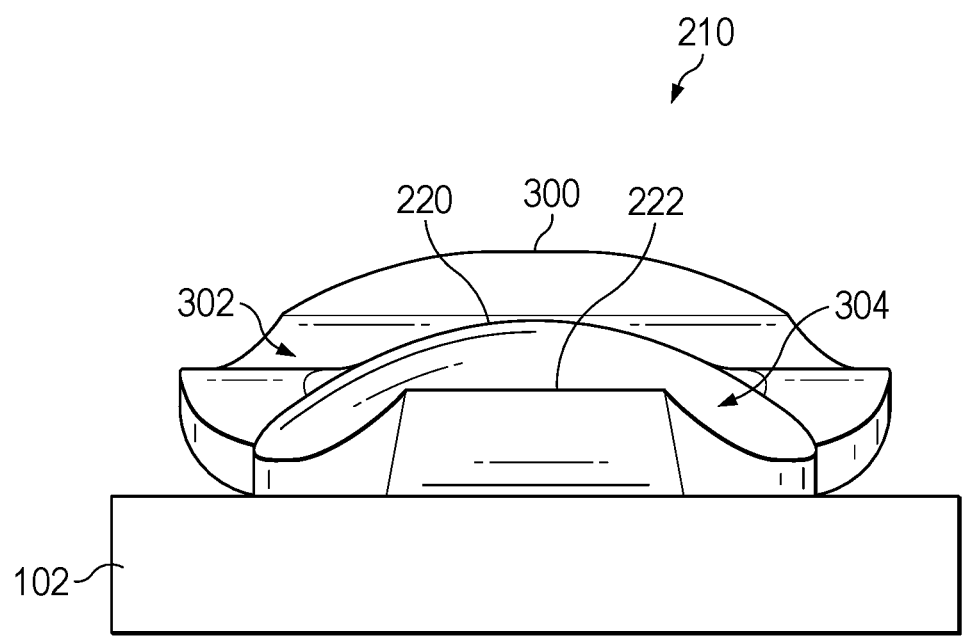
Figure 3D:
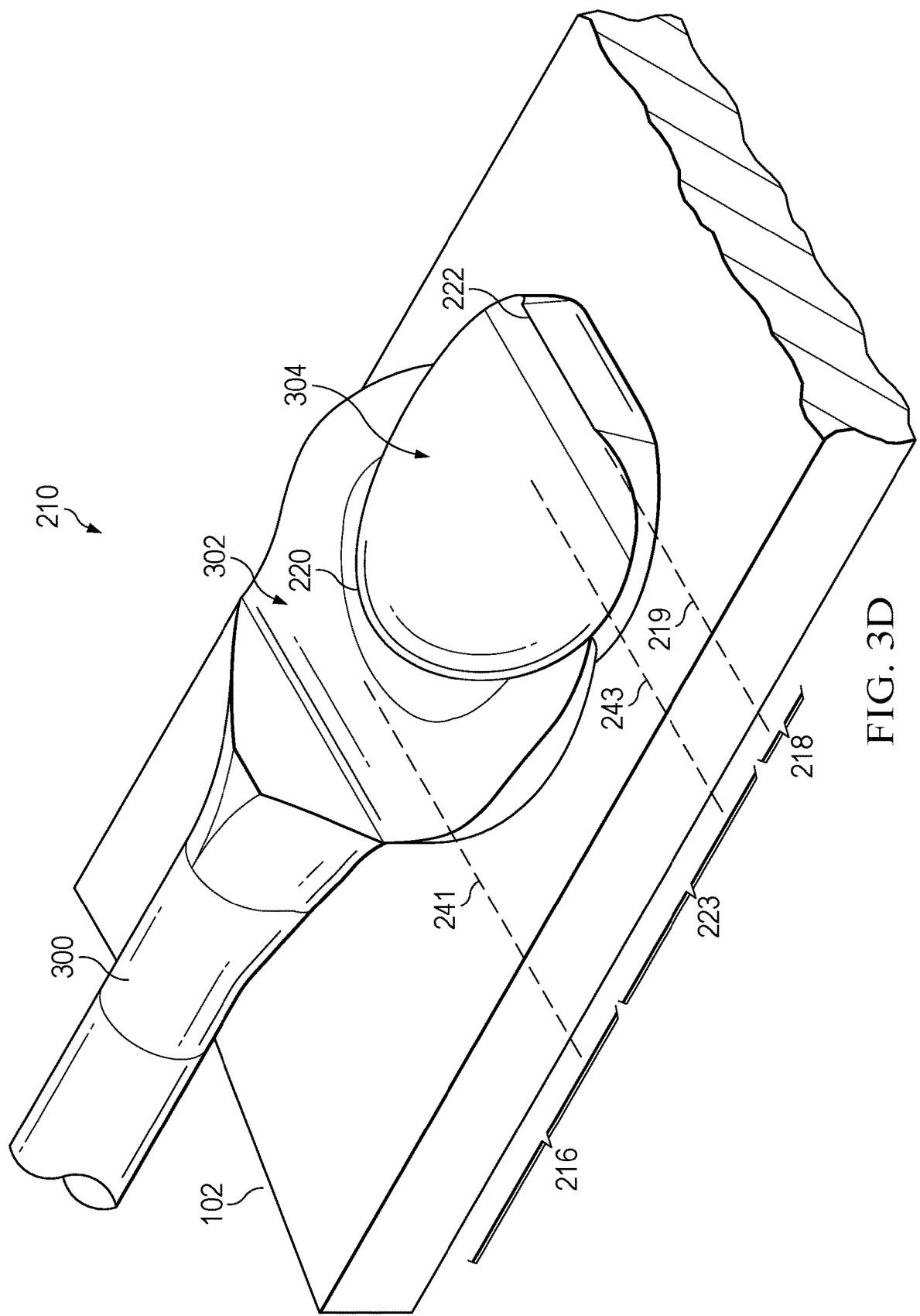

FIGS. 3A, 3B, 3C, and 3D are profile, top-down, frontal, and perspective views, respectively, of a bond wire coupled to an electrically conductive surface by a pair of contiguous stitch bonds, in accordance with various examples. More specifically, FIG. 3A shows a profile cross-sectional view of a double stitch bond by which a single bond wire is coupled to an electrically conductive surface. FIG. 3A depicts an example bond wire 210 coupled to an example electrically conductive surface of a conductive terminal 102 by a first stitch bond 216 and a second stitch bond 223. The distal end of the first stitch bond 216 overlaps with the proximal end of the second stitch bond 223. A top surface 300 of the bond wire 210 includes a first ridge 220 and a second ridge at the tail 222. The first ridge 220 marks the area of overlap between the distal end of the first stitch bond 216 and the proximal end of the second stitch bond 223. The second ridge at the tail 222 is vertically coincident with the tail bond 218, as numeral 219 shows. Depressions 302 and 304 are present on multiple, opposing sides of first ridge 220, and depression 304 is present between the ridges 220, 222. The ridges 220, 222 and depressions 302, 304 are formed as a result of the specific stitch bonding technique by which the stitch bonds 216, 223 and tail bond 218 are formed, which is described in greater detail below. A ridge is defined as a point of the top surface 300 that is higher (i.e., farther away from the conductive terminal 102) than points of the top surface 300 on both sides of the ridge, or, in the case of the distal end of the bond wire 210, on one side of the ridge. Ridges 220 and 222 both meet this definition. The depression 302 is vertically coincident with the first stitch bond 216, as numeral 241 shows. The depression 304 is vertically coincident with the second stitch bond 223, as numeral 243 shows. FIG. 3B is a top-down view of the structure of FIG. 3A. FIG. 3C is a frontal view of the structure of FIG. 3A. FIG. 3D is a perspective view of the structure of FIG. 3A.

The length of the first stitch bond 216, which is defined as the total length over which the bond wire 210 is bonded to the electrically conductive surface of the conductive terminal 102 at the first stitch bond 216, ranges between 100% and 150% of the diameter of the bond wire 210, with a length exceeding this range being disadvantageous because it will significantly increase the risk of a short tail and subsequent detachment from the electrically conductive surface, and with a length below this range being disadvantageous because a proper stitch bond will not be established on the electrically conductive surface.

The length of the second stitch bond 223, which is defined as the total length over which the bond wire 210 is bonded to the electrically conductive surface of the conductive terminal 102 at the second stitch bond 223, ranges between 100% and 150% of the diameter of the bond wire 210, with a length exceeding this range being disadvantageous because it will significantly increase the risk of a short tail and subsequent detachment from the electrically conductive surface, and with a length below this range being disadvantageous because the stitch bond is at significant risk for peeling from the electrically conductive surface.

Figure 4A:
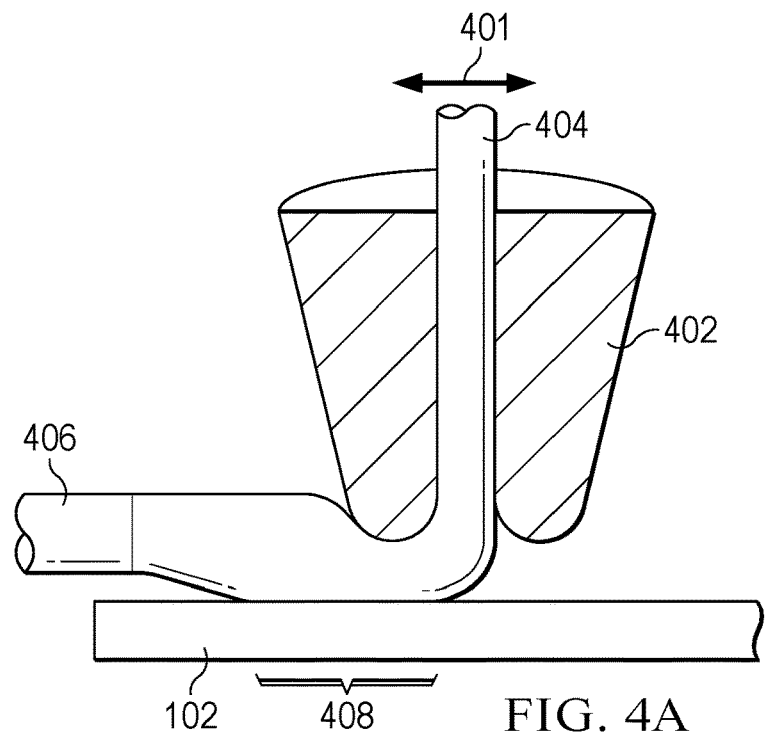
FIGS. 4A, 4B, 4C, and 4D depict a process flow of a technique to couple a bond wire to an electrically conductive surface by a pair of overlapping stitch bonds, in accordance with various examples.
Figure 4B:
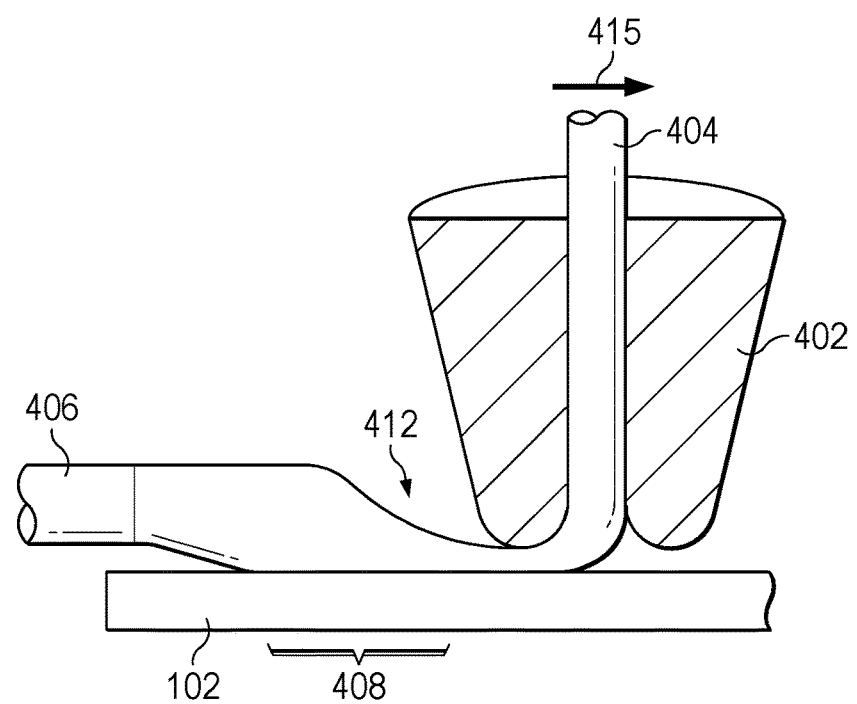
Figure 4C:
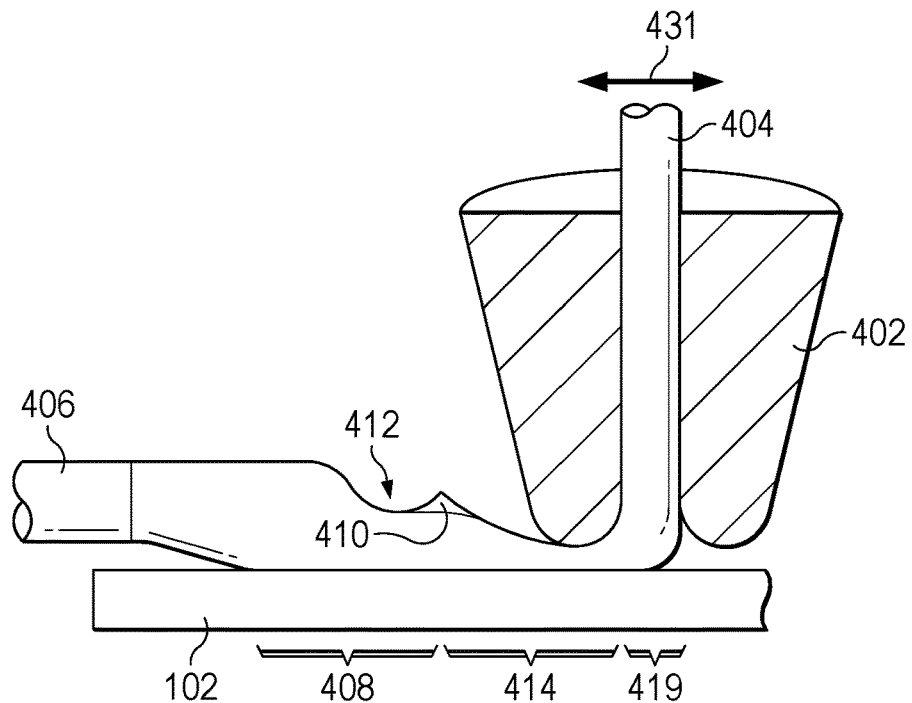
Figure 4D:
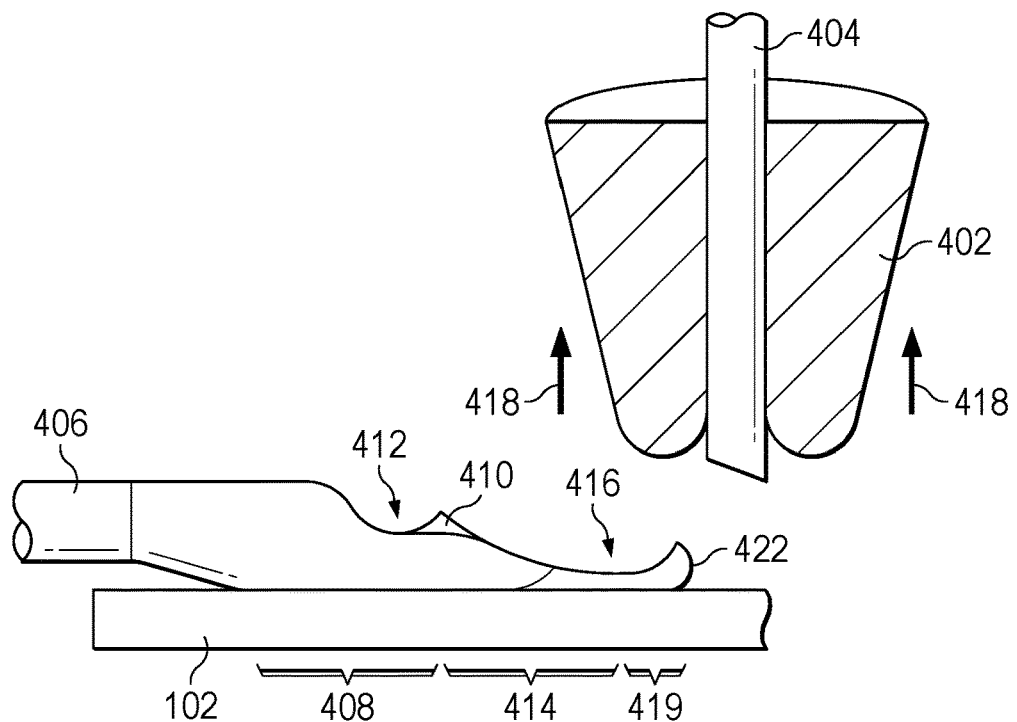
Figure 5:
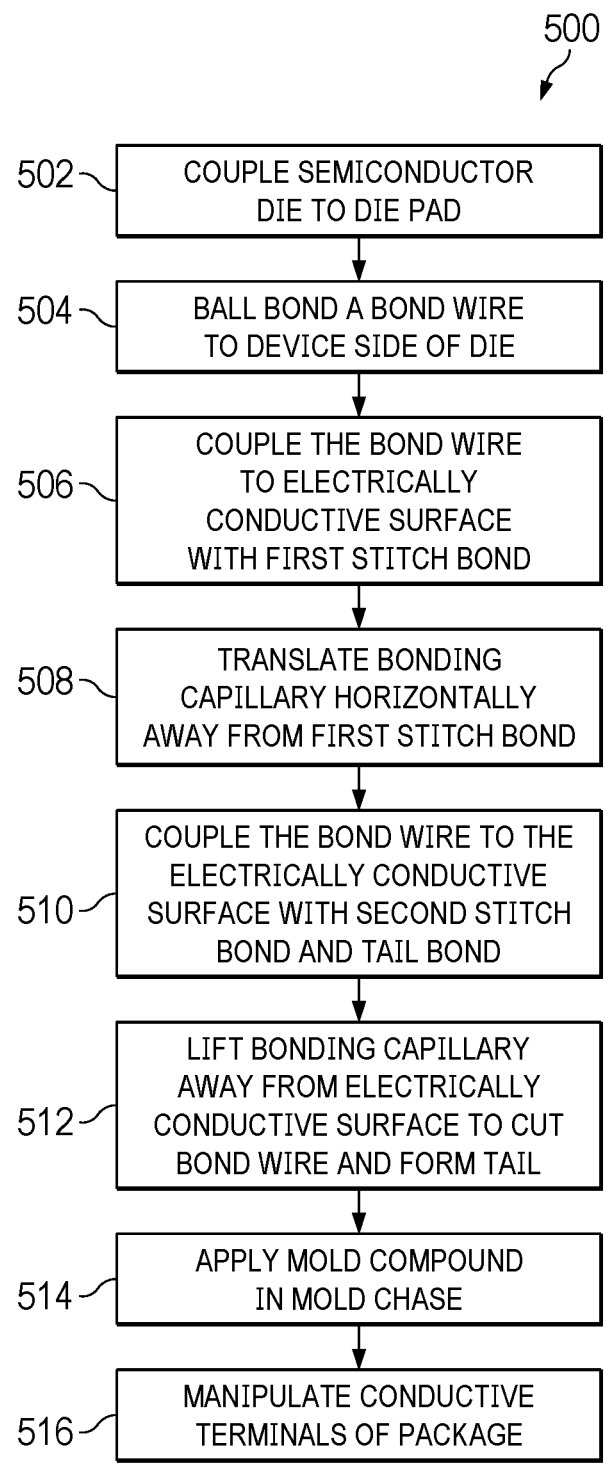
FIG. 5 is a flow diagram of a method to manufacture a semiconductor package having a bond wire coupled to an electrically conductive surface by a pair of overlapping stitch bonds, in accordance with various examples.

FIGS. 4A, 4B, 4C, and 4D depict a process flow of a technique to couple a bond wire to an electrically conductive surface by a pair of overlapping stitch bonds, in accordance with various examples. FIG. 5 is a flow diagram of a method 500 to manufacture a semiconductor package having a bond wire coupled to an electrically conductive surface by a pair of overlapping stitch bonds, in accordance with various examples. FIGS. 4A, 4B, 4C, 4D, and 5 are now described in parallel.

The method 500 begins with coupling a semiconductor die to a die pad (502), such as the semiconductor die 202 to the die pad 204 (FIG. 2A). The method 500 includes forming a ball bond to a device side of the semiconductor die using a bond wire (504). Steps 502 and 504 are not depicted in FIGS. 4A-4D. The method 500 includes coupling the bond wire to an electrically conductive surface with a first stitch bond (506). FIG. 4A depicts a conductive terminal 102 and a wire bonding capillary 402. Other wire bonding equipment coupled to and/or used in tandem with the bonding capillary 402 is not expressly depicted to facilitate ease of understanding. A supply 404 of bond wire passes through the bonding capillary 402. Numeral 406 denotes bond wire that has been expelled from the bonding capillary 402. As shown, the bonding capillary 402 applies heat, force, and ultrasonic energy (as numeral 401 denotes) to the expelled bond wire 406, thereby forming a first stitch bond 408 between the expelled bond wire 406 and the electrically conductive surface of the conductive terminal 102.

To form the first stitch bond 408, the bonding capillary 402 applies heat of a temperature ranging from 50 degrees Celsius to 300 degrees Celsius, with a temperature below this range being disadvantageous because the bond wire will not couple to the electrically conductive surface, and with a temperature above this range being disadvantageous because it significantly raises the risk of delamination of the electrically conductive surface. The force applied ranges from 50 grams to 300 grams, with a force below this range being disadvantageous because the bond wire will not couple to the electrically conductive surface, and with a force above this range being disadvantageous because it may result in mechanical damage to the bond wire or stitch bond. The ultrasonic energy is applied with a scrub amplitude ranging from 0.5 microns to 5 microns, with a scrub amplitude below this range being disadvantageous because the bond wire will not couple to the electrically conductive surface, and with a scrub amplitude above this range being disadvantageous because it may result in mechanical damage to the bond wire or stitch bond.

The method 500 includes translating the bonding capillary horizontally, away from the first stitch bond by a distance that is at least two times a diameter of the bond wire (508). FIG. 4B shows such horizontal (lateral) translation, with arrow 415 indicating movement of the bonding capillary 402 toward the right. This lateral movement enables the second stitch bond to be formed overlapping with the distal end of the first stitch bond but not in total vertical alignment with the first stitch bond. The shape of the bonding capillary 402 results in the formation of the depression 412.

The method 500 includes coupling the bond wire to the electrically conductive surface with a second stitch bond and tail bond (510). FIG. 4C shows the formation of a second stitch bond 414 and tail bond 419 by applying heat, force, and ultrasonic energy to the bond wire 406. The scrubbing motion associated with application of the ultrasonic energy, indicated by numeral 431, produces the ridge 410. The temperature of the heat applied ranges from 50 degrees Celsius to 300 degrees Celsius, with a temperature below this range being disadvantageous because it significantly raises the risk of stitch bond peeling, and with a temperature above this range being disadvantageous because it significantly raises the risk of delamination of the electrically conductive surface. The bonding force applied ranges from 10 grams to 700 grams, with a force below this range being disadvantageous because it significantly raises the risk of stitch bond peeling, and with a force above this range being disadvantageous because it will produce a tail that is vulnerable to detachment from the electrically conductive surface. The ultrasonic energy applied includes a scrub amplitude ranging from 0.5 microns to 5 microns, with a scrub amplitude below this range being disadvantageous because it significantly raises the risk of stitch bond peeling, and with a scrub amplitude above this range being disadvantageous because it will produce a tail that is vulnerable to detachment from the electrically conductive surface.

The method 500 includes clamping the bond wire and lifting the bonding capillary away from the electrically conductive surface to cut the bond wire and to form a tail (512). FIG. 4D depicts the lifting away of the bonding capillary 402 from the electrically conductive surface, as arrows 418 depict, thereby forming a tail 422. As with the depression 412, the depression 416 is formed by the shape of the capillary 402 as the capillary 402 forms the second stitch bond 414 and tail bond 419.

The method 500 subsequently includes applying a mold compound using a mold chase (514) and manipulating the conductive terminals (e.g., leads) of the package (516), such as by trimming and bending the conductive terminals as desired.

Figure 6:
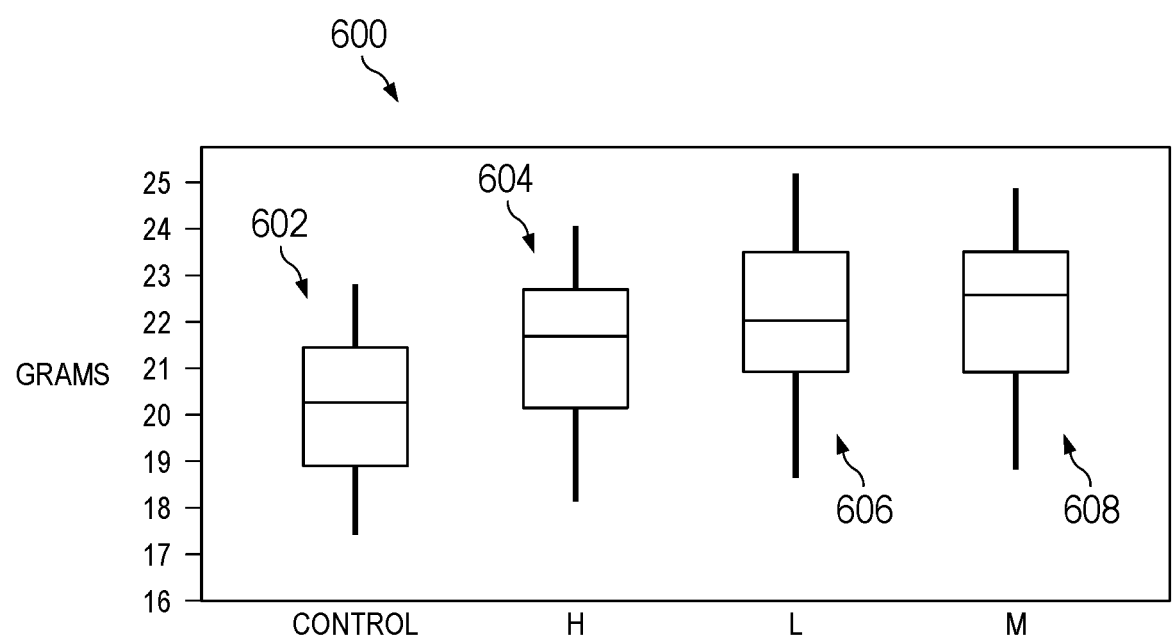
FIG. 6 is a box plot showing superior bond strength of overlapping stitch bonds in accordance with various examples.

FIG. 6 is a box plot 600 showing the superior bond strength of contiguous stitch bonds in accordance with various examples. Specifically, the box plot 600 includes elements depicting the superior strength of the double stitch bonding technique described herein as demonstrated by a wire pull test. The box plot 600 includes a control element 602, which depicts the strength of a traditional stitch bond using a 1.3 mil bond wire when subjected to the wire pull test; element 604, which depicts the strength of a double stitch bond as described herein using a 1.3 mil bond wire and a 4 micron scrub amplitude; element 606, which depicts the strength of a double stitch bond as described herein using a 1.3 mil bond wire and a 2 micron scrub amplitude; and element 608, which depicts the strength of a double stitch bond as described herein using a 1.3 mil bond wire and a 3 micron scrub amplitude. Heat and forces applied during stitch bonding were kept uniform across all stitch bonds tested. The strengths of the double stitch bonds as shown in elements 604, 606, and 608 exceed that of the control element 602. Further, Table 1 below depicts where on the bond wire breakage occurred during the wire pull test (e.g., whether at the bond wire neck (e.g., neck 213 in FIG. 2A), the bond wire span (e.g., span 214 in FIG. 2A), or at the stitch bond (e.g., in the case of the double stitch bonds described herein, at the tail end stitch bond, such as second stitch bond 414 in FIG. 4D).

TABLE 1

| Wire pull test fail location | Control (traditional stitch bond) | Qual-L | Qual-M | Qual-H |
| --- | --- | --- | --- | --- |
| Neck | 0% | 1% | 0% | 0% |
| Span | 75% | 79% | 93% | 86% |
| Stitch bond | 25% | 20% | 7% | 14% |

As Table 1 shows, in the traditional stitch bond technique, wire pull tests caused breakage most frequently at the span and next most frequently at the stitch bond, with few breakages occurring at the neck. In contrast, the three double stitch bond columns show, relative to the control column, a trend away from breakage at the stitch bond and toward breakage at the span. This indicates an increase in stitch bond reliability and strength in the double stitch bond technique relative to the traditional stitch bond technique.

Unless otherwise stated, "about," "approximately," or "substantially" preceding a parameter means being within +/−10 percent of that parameter. Modifications are possible in the described examples, and other examples are possible within the scope of the claims.

What is claimed is:

1. A semiconductor package, comprising:
an electrically conductive surface; and
a bond wire coupled to the electrically conductive surface, the bond wire including:
a first stitch bond coupled to the electrically conductive surface; and
a second stitch bond contiguous with the first stitch bond and coupled to the electrically conductive surface, the second stitch bond partially, but not completely, overlapping with the first stitch bond, wherein:
a top surface of the bond wire includes a first ridge and a second ridge;
a plane along the top surface of the first ridge is above a plane along a top surface of the second ridge.

2. The semiconductor package of claim 1, wherein the top surface of the bond wire includes a depression between the first and second ridges.

3. The semiconductor package of claim 2, wherein the top surface includes a depression on multiple sides of the first ridge.

4. The semiconductor package of claim 1, wherein a length over which the first stitch bond is coupled to the electrically conductive surface ranges from 100% to 150% of a diameter of the bond wire.

5. The semiconductor package of claim 1, wherein a length over which the second stitch bond is coupled to the electrically conductive surface ranges from 100% to 150% of a diameter of the bond wire.

6. A semiconductor package, comprising:
an electrically conductive surface; and
a bond wire coupled to the electrically conductive surface, the bond wire including:
a first stitch bond between the bond wire and the electrically conductive surface, the first stitch bond vertically coinciding with a first depression on a top surface of the bond wire; and
a second stitch bond between the bond wire and the electrically conductive surface, the second stitch bond vertically coinciding with a second depression on the top surface of the bond wire,
wherein:
a first end of the first stitch bond overlaps with a second end of the second stitch bond;
a ridge is positioned between the first depression and the second depression; and
a plane along the top surface of the first ridge is below a plane along a highest point of the top surface of the bond wire that is in contact with the electrically conductive surface.

7. The semiconductor package of claim 6, wherein a distal end of the second stitch bond includes a tail bond that is vertically aligned with a second ridge on the top surface of the bond wire.

8. The semiconductor package of claim 6, wherein a length over which the first stitch bond is coupled to the electrically conductive surface ranges from 100% to 150% of a diameter of the bond wire.

9. The semiconductor package of claim 6, wherein a length over which the second stitch bond is coupled to the electrically conductive surface ranges from 100% to 150% of a diameter of the bond wire.

10. A semiconductor package, comprising:
a surface of a lead; and
a bond wire coupled to the lead, the bond wire including:
a first stitch bond contacting the surface; and
a second stitch bond contiguous with the first stitch bond and contacting surface, the second stitch bond partially, but not completely, overlapping with the first stitch bond, wherein:
a top surface of the bond wire includes a first ridge and a second ridge;
a first plane along the top surface of the first ridge is above a second plane along a top surface of the second ridge; and
a plane along a highest point of the top surface of the bond wire that is in contact with the lead is above the first plane.

11. The semiconductor package of claim 10, wherein the package further includes a semiconductor die including a bond pad.

12. The semiconductor package of claim 11, wherein a portion of the bond wire is attached to the bond pad.

13. The semiconductor package of claim 12, wherein the portion of the bond wire is attached to the bond pad via a ball bond.

14. The semiconductor package of claim 10, wherein a distal end of the second stitch bond includes a tail bond that is vertically aligned with a second ridge on the top surface of the bond wire.

15. The semiconductor package of claim 10, wherein the second stich bond is created by moving a capillary horizontally away from the first stitch bond by a distance of at least two times a diameter of the bond wire.

* * * * *